(12) United States Patent
Yamagami et al.

(10) Patent No.: US 8,830,773 B2
(45) Date of Patent: Sep. 9, 2014

(54) SEMICONDUCTOR DEVICE HAVING COMPENSATION CAPACITANCE

(75) Inventors: Minoru Yamagami, Tokyo (JP); Hisayuki Nagamine, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 360 days.

(21) Appl. No.: 13/419,293

(22) Filed: Mar. 13, 2012

(65) Prior Publication Data

US 2012/0236669 A1    Sep. 20, 2012

(30) Foreign Application Priority Data

Mar. 15, 2011   (JP) .................. 2011-056528

(51) Int. Cl.

| | | |
|---|---|---|
| *G11C 7/02* | (2006.01) | |
| *G11C 11/4097* | (2006.01) | |
| *G11C 7/22* | (2006.01) | |
| *G11C 11/4074* | (2006.01) | |
| *G11C 11/4091* | (2006.01) | |
| *H01L 23/522* | (2006.01) | |
| *H01L 23/528* | (2006.01) | |
| *H01L 27/02* | (2006.01) | |
| *H01L 49/02* | (2006.01) | |
| *H01L 29/94* | (2006.01) | |
| *H01L 27/108* | (2006.01) | |

(52) U.S. Cl.
CPC ............ *G11C 11/4097* (2013.01); *G11C 7/22* (2013.01); *G11C 11/4074* (2013.01); *G11C 11/4091* (2013.01); *H01L 23/5223* (2013.01); *H01L 23/5286* (2013.01); *H01L 27/0203* (2013.01); *H01L 27/0207* (2013.01); *H01L 27/10885* (2013.01); *H01L 27/10894* (2013.01); *H01L 27/10897* (2013.01); *H01L 28/86* (2013.01); *H01L 29/94* (2013.01); *H01L 2924/0002* (2013.01)
USPC ........................................ 365/207

(58) Field of Classification Search
USPC ...................... 365/189.011–225.7
See application file for complete search history.

(56) References Cited

U.S. PATENT DOCUMENTS

| 2001/0050385 A1* | 12/2001 | Kotecki et al. ............... 257/296 |
|---|---|---|
| 2002/0018390 A1* | 2/2002 | Confalonieri et al. ........ 365/226 |
| 2002/0099988 A1* | 7/2002 | Osama et al. ................ 714/718 |
| 2006/0044066 A1* | 3/2006 | Forbes et al. ................ 330/292 |
| 2010/0110817 A1* | 5/2010 | Noda et al. .................. 365/222 |
| 2010/0124109 A1* | 5/2010 | Honma et al. ........... 365/185.03 |
| 2010/0246302 A1* | 9/2010 | Seko ............................. 365/205 |
| 2011/0080797 A1* | 4/2011 | Furutani ...................... 365/205 |

FOREIGN PATENT DOCUMENTS

JP    2010-182392 A    8/2010

* cited by examiner

*Primary Examiner* — Harry W Byrne
(74) *Attorney, Agent, or Firm* — McGinn IP Law Group, PLLC

(57) ABSTRACT

Disclosed herein is a device that includes: first and second memory mats each including a plurality of bit lines; a sense area arranged between the first and second memory mats; a column selection line provided on the first memory mat; and a compensation capacitance provided on the second memory mat. The sense area includes a plurality of sense amplifiers. Each of the sense amplifiers is connected to an associated one or ones of the bit lines. At least one of the sense amplifiers is selected based on a column selection signal supplied via the column selection line. At least a part of the compensation capacitance is formed in a same wiring layer as the column selection line.

12 Claims, 13 Drawing Sheets

SEMICONDUCTOR DEVICE HAVING COMPENSATION CAPACITANCE

BACKGROUND OF THE INVENTION

1. Field of the Invention

The present invention relates to a semiconductor device and more particularly relates to a semiconductor device including a compensation capacitance for power-source voltage.

2. Description of Related Art

In a semiconductor device such as a DRAM (Dynamic Random Access Memory), a compensation capacitance for power-source voltage is sometimes provided to stabilize an internal power-source voltage (see Japanese Patent Application Laid-open No. 2010-182392). A gate capacitance of a MOS transistor is generally used as the compensation capacitance for the power-source voltage.

However, when the gate capacitance is used as the compensation capacitance for the power-source voltage, it is necessary to form a MOS transistor for the compensation capacitance for the power-source voltage on a semiconductor substrate, which causes a problem of increasing the chip size. In addition, if the compensation capacitance for the power-source voltage becomes insufficient at a later stage of designing, it necessitates a change of a device layout on the semiconductor substrate to add an additional MOS transistor for increasing the compensation capacitance for the power-source voltage, which in turn causes a problem of increasing the time for development.

SUMMARY

In one embodiment, there is provided a semiconductor device that includes: a plurality of memory mats arranged in a first direction; a plurality of sense areas each arranged between two of the memory mats, each of the sense areas including a plurality of sense amplifiers selected based on a column selection signal; a column decoder generating the column selection signal; a column selection line extending in the first direction on the memory mats and supplying the column selection signal from the column decoder to the sense areas; and a compensation capacitance provided on one of the memory mats which is located farther than the other of the memory mats from the column decoder. The compensation capacitance includes a first capacitance electrode to which a first power source potential is supplied and a second capacitance electrode to which a second power source potential is supplied, and at least one of the first and second capacitance electrodes is formed in a same wiring layer as the column selection line.

In another embodiment, there is provided a semiconductor device that includes: first and second memory mats each including a plurality of bit lines; a sense area arranged between the first and second memory mats; a column selection line provided on the first memory mat; and a compensation capacitance provided on the second memory mat. The sense area includes a plurality of sense amplifiers. Each of the sense amplifiers is connected to an associated one or ones of the bit lines. At least one of the sense amplifiers is selected based on a column selection signal supplied via the column selection line. At least a part of the compensation capacitance is formed in a same wiring layer as the column selection line.

DETAILED DESCRIPTION OF THE EMBODIMENTS

Preferred embodiments of the present invention will be explained below in detail with reference to the accompanying drawings.

Figure 1:
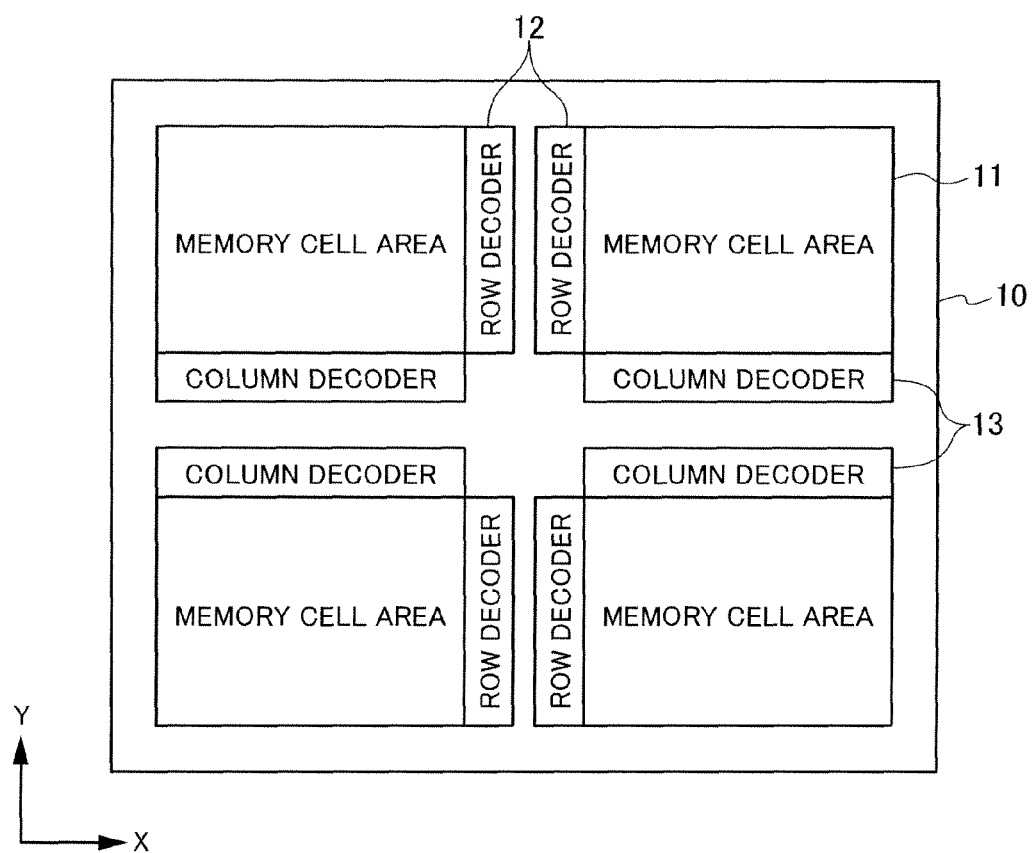
FIG. 1 is an overall layout diagram indicative of an embodiment of a semiconductor device 10 according to an embodiment of the present invention.

Referring now to FIG. 1, the semiconductor device 10 according to the present embodiment is a DRAM, which includes four memory cell areas 11. In each of the memory cell areas 11, a row decoder 12 is provided while being adjacent to the X direction of the memory cell area 11 and a column decoder 13 is provided while being adjacent to the Y direction of the memory cell area 11. The row decoder 12 is arranged between two memory cell areas 11 adjacent to each other in the X direction, and the column decoder 13 is arranged between two memory cell areas 11 adjacent to each other in the Y direction.

Figure 2:
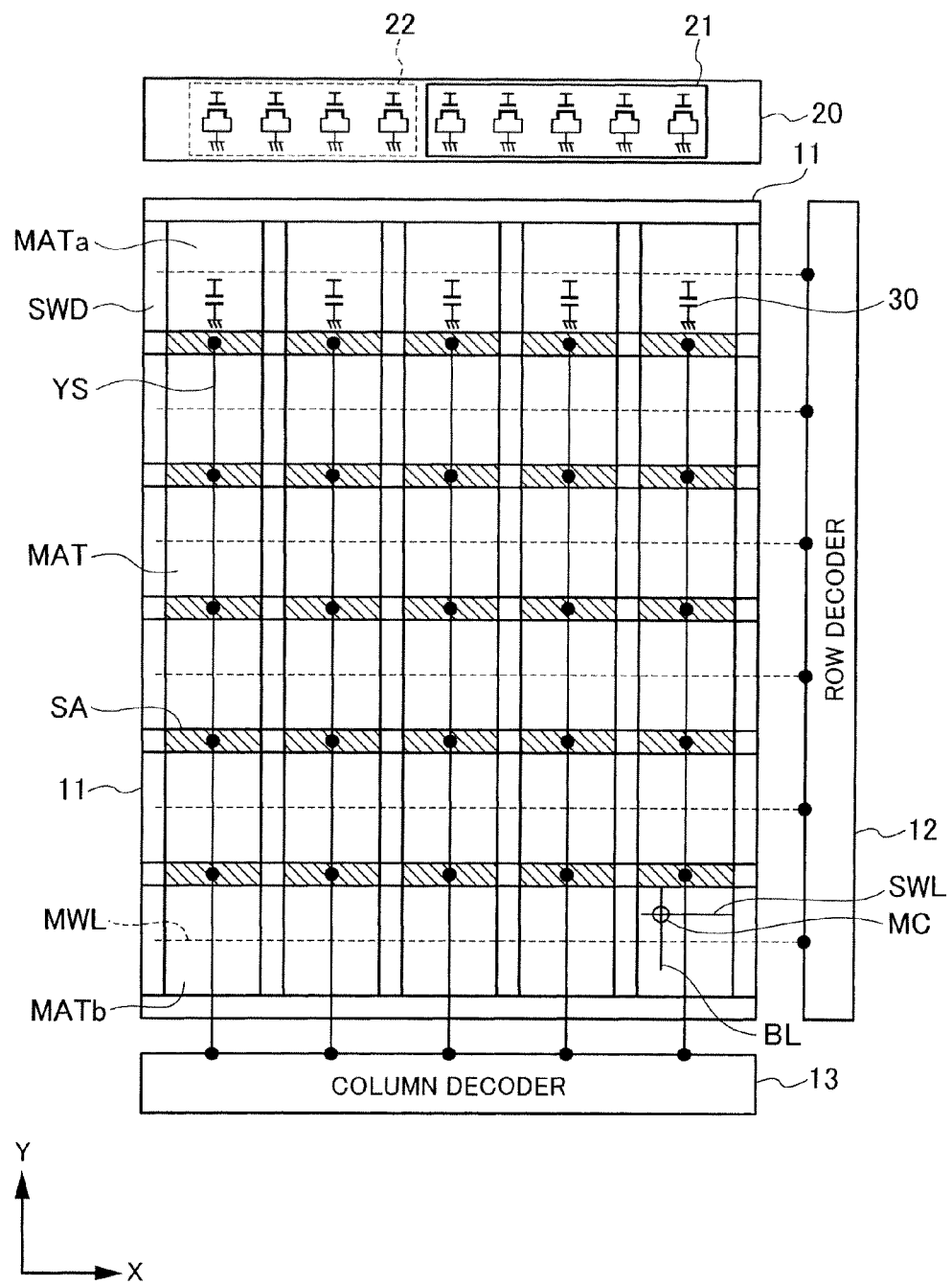
FIG. 2 is an enlarged diagram indicative of an embodiment of the memory cell area 11 shown in FIG. 1.

Turning to FIG. 2, the memory cell area 11 includes a plurality of memory mats MAT arranged in a matrix form. Sub-word driver areas SWD are arranged on both sides of each of the memory mats MAT in the X direction, and sense areas SA are arranged on both sides of the memory mat MAT in the Y direction. However, for memory mats MATa and MATb located at respective edges of the memory cell area 11 in the Y direction, the sense area SA is located only on one side in the Y direction. Therefore, each sense area SA is arranged while being sandwiched by two memory mats MAT adjacent to each other in the Y direction. In this explanation, the memory mat MATa represents a memory mat that is farthest from the column decoder 13, and the memory mat MATb represents a memory mat closest to the column decoder 13. The sense areas SA are shown as being hatched in FIG. 2.

Main word lines MWL that are driven by the row decoder 12 are respectively connected to the sub-word drive areas SWD. Each of the main word lines MWL is a signal line for transmitting a main word signal, and is provided while extending in the X direction as shown in FIG. 2. The main word signal is a signal for selecting one of a plurality of sub-word drivers included in the sub-word drive areas SWD. The sub-word driver is a circuit for driving a sub-word line SWL provided while extending in the X direction in the memory mat MAT.

Column selection lines YS driven by the column decoder 13 are respectively connected to the sense areas SA. Each of the column selection lines YS is a signal line for transmitting a column selection signal, which is provided while extending in the Y direction as shown in FIG. 2. The column selection signal is a signal for selecting one of a plurality of sense amplifiers included in the sense areas SA. The sense amplifier is a circuit for amplifying a signal on a bit line BL provided while extending in the Y direction in the memory mat MAT. A memory cell MC is located at an intersection of the bit line BL and the sub-word line SWL.

Figure 3:
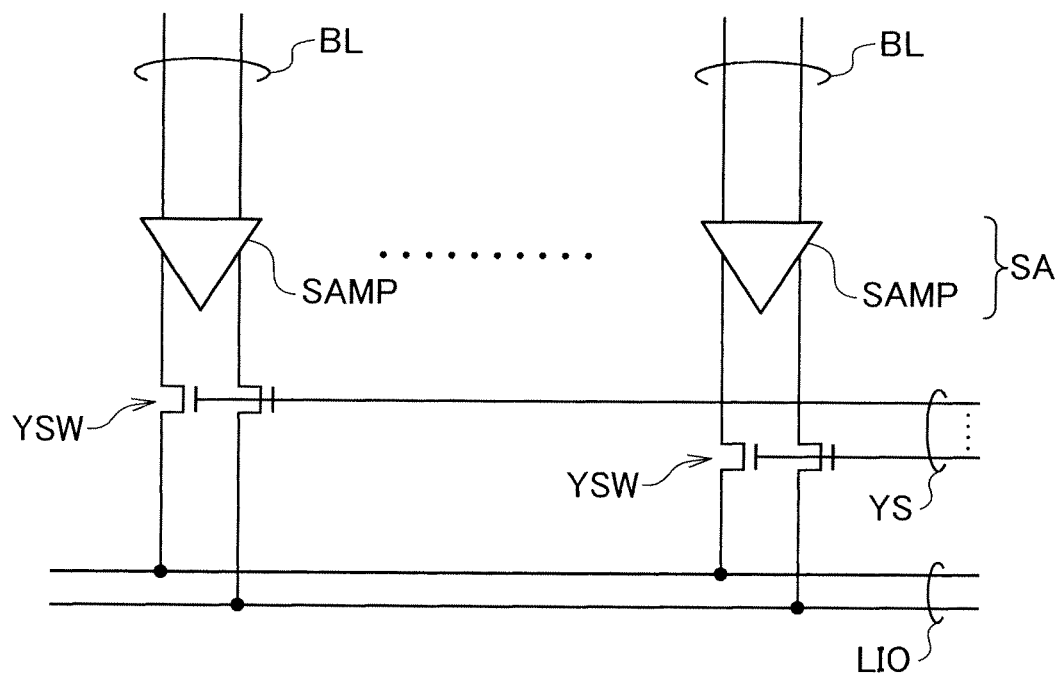
FIG. 3 is a circuit diagram for explaining a method of selecting a sense amplifier.

Turning to FIG. 3, the sense areas SA include a plurality of sense amplifiers SAMP, and a pair of bit lines BL is connected to each of the sense amplifiers SAMP. With this configuration, when the sense amplifier SAMP is activated, a potential difference generated between the pair of bit lines BL is amplified. Each of the sense amplifiers SAMP is connected to a local I/O line LIO via a column switch YSW corresponding to the sense amplifier SAMP. The column switch YSW is provided for each of the sense amplifiers SAMP, and a corresponding bit of the column selection signal is supplied to a gate electrode of a MOS transistor constituting the column switch YSW. With this configuration, it is possible to select a desired sense amplifier SAMP based on the column selection signal.

Referring back to FIG. 2, a compensation capacitance area 20 is provided outside the memory cell area 11. In the example shown in FIG. 2, the compensation capacitance area 20 is arranged on the opposite side of the column decoder 13 across the memory cell area 11. The compensation capacitance area 20 is an area in which a compensation capacitance for stabilizing an internal power-source voltage is arranged. The compensation capacitance for the power-source voltage arranged in the compensation capacitance area 20 is obtained by using a gate capacitance of a MOS transistor, and a plurality of types of MOS transistors are used according to a voltage level of an internal power source to be stabilized. In the example shown in FIG. 2, a compensation capacitance 21 for the power-source voltage using MOS transistors having thin gate dielectric films and a compensation capacitance 22 for the power-source voltage using MOS transistors having thick gate dielectric films are used. The compensation capacitance 21 is used for stabilizing an internal power source with a low voltage level, while the compensation capacitance 22 is used for stabilizing an internal power source with a high voltage level.

In addition to the compensation capacitance area 20, a compensation capacitance 30 for the power-source voltage is provided on the memory mat MATa that is located farthest from the column decoder 13 in the semiconductor device 10 according to the present embodiment. The compensation capacitance 30 provided on the memory mat MATa is a capacitance obtained by using the same wiring layer as the column selection line YS. The compensation capacitance 30 can be arranged on the memory mat MATa that is located at the far end, because the column selection line YS is a wiring line for connecting the column decoder 13 and the sense amplifier area SA and it does not need to be wired on the memory mat MATa that is located the far end so that there is an empty space on the same wiring layer as the column selection line YS on the memory mat MATa that is located at the far end.

Figure 4A:
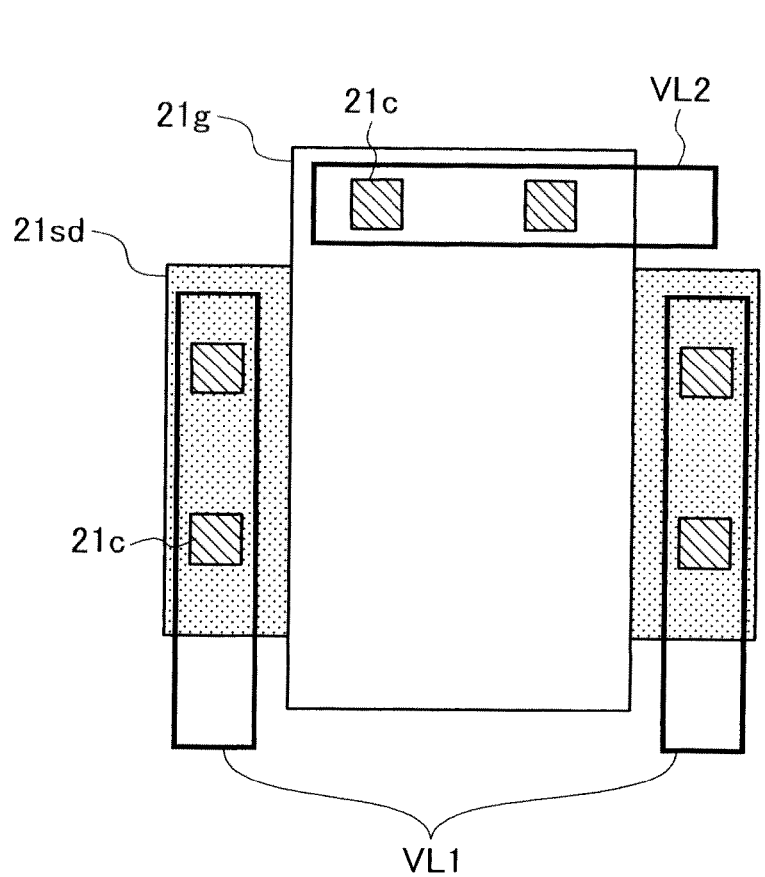
FIG. 4A is a layout diagram indicative of an embodiment of the compensation capacitance for the power-source voltage 21.
Figure 4B:
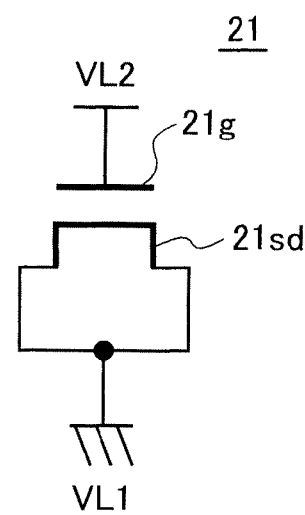
FIG. 4B is an equivalent circuit diagram indicative of an embodiment of the compensation capacitance for the power-source voltage 21.

Turning to FIGS. 4A and 4B, the compensation capacitance 21 for the power-source voltage is constituted by a gate electrode 21g and diffusion regions 21sd that constitute a MOS transistor, and a gate dielectric film (not shown) between the gate electrode 21g and the diffusion regions 21sd functions as a capacitance dielectric film. In the present example, the diffusion regions 21sd are connected to a power source line VL1 via a contact conductor 21c and the gate electrode 21g is connected to a power source line VL2 via a contact conductor 21c. The power source line VL1 is, for example, a power source line to which a ground potential (VSS) is supplied, and the power source line VL2 is, for example, a power source line to which an internal power-source voltage is supplied. The compensation capacitance 22 for the power-source voltage also has a similar configuration.

Figure 5A:
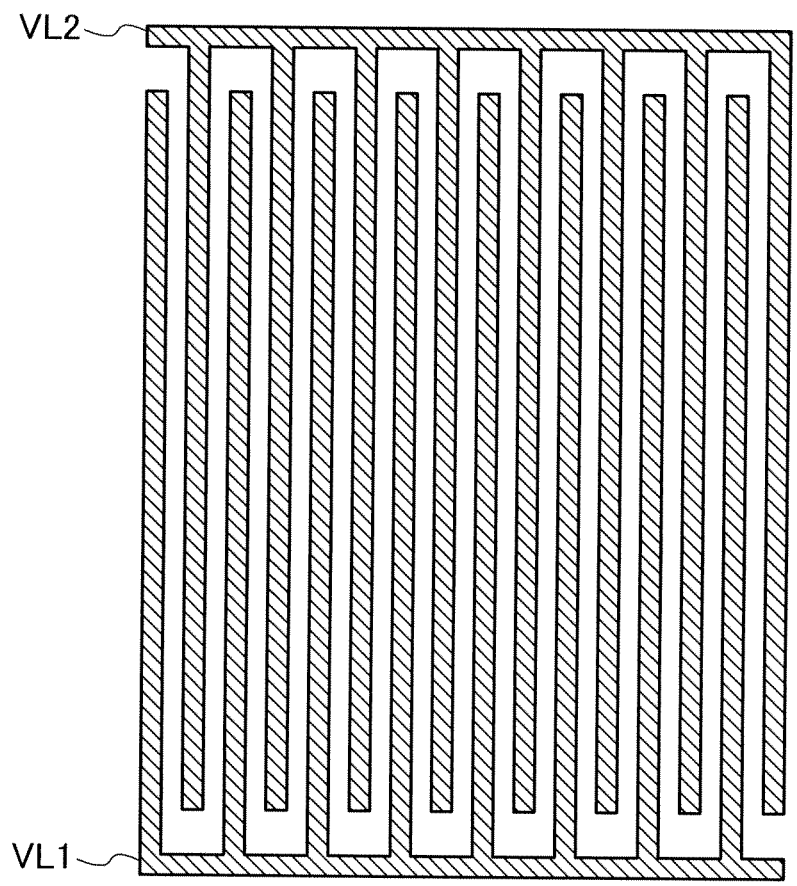
FIG. 5A is a layout diagram indicative of an embodiment of the compensation capacitance for the power-source voltage 30.
Figure 5B:
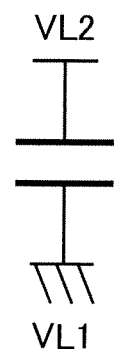
FIG. 5B is an equivalent circuit diagram indicative of an embodiment of the compensation capacitance for the power-source voltage 30.

Turning to FIGS. 5A and 5B, the compensation capacitance 30 for the power-source voltage is constituted by a power source line VL1 and a power source line VL2 formed in a comb shape on a predetermined wiring layer. That is, the compensation capacitance 30 is a planar capacitance formed in a wiring layer, and unlike the compensation capacitance 21, the compensation capacitance 30 does not occupy a semiconductor substrate.

Figure 6:
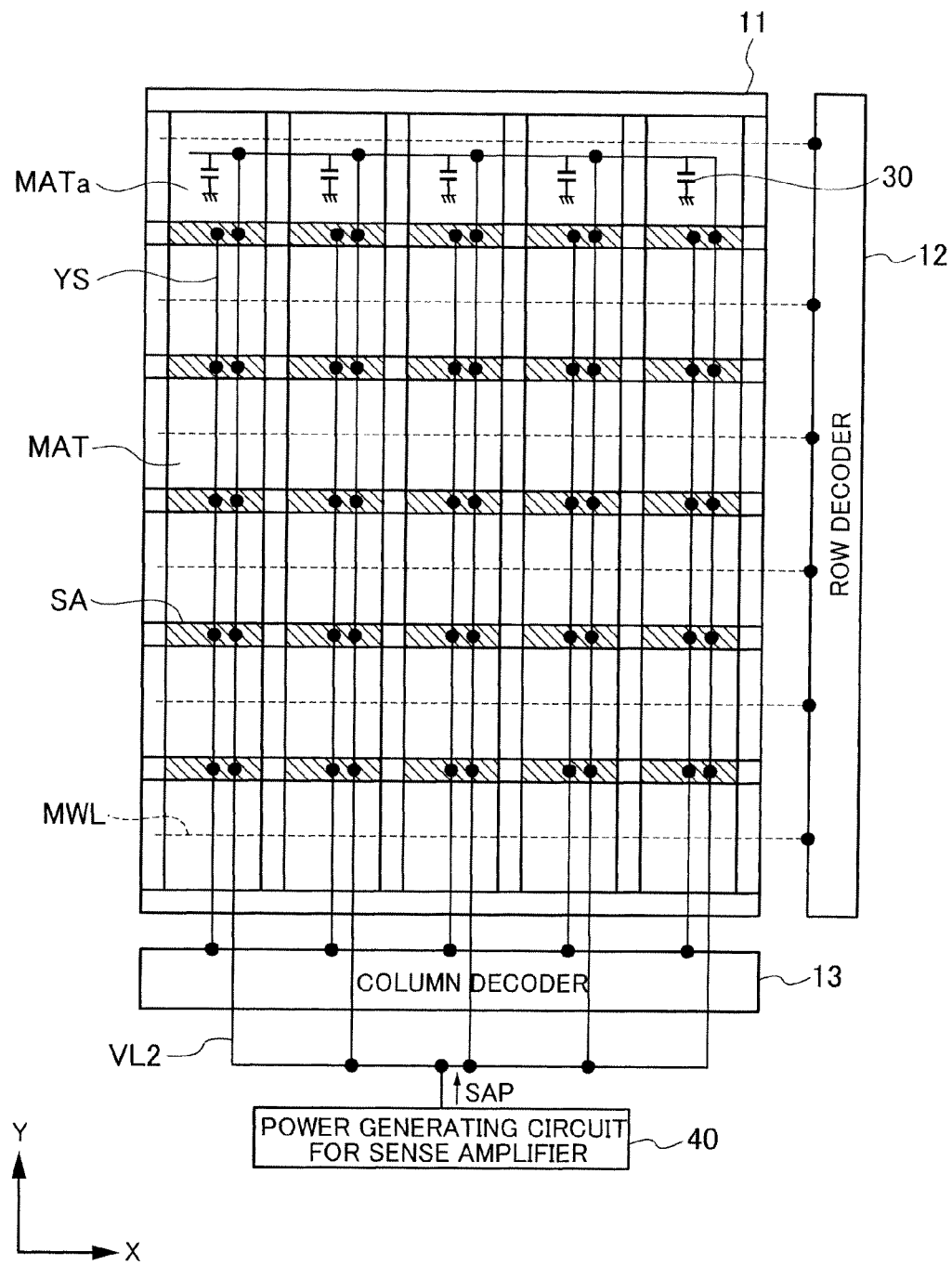
FIG. 6 is a schematic diagram showing an example of stabilizing an operating potential of a sense amplifier by the compensation capacitance for the power-source voltage 30.

Turning to FIG. 6, a power generating circuit (power source circuit) 40 for a sense amplifier is arranged near the column decoder 13, and an operating potential SAP of a sense amplifier is generated by the power source circuit 40. The operating potential SAP is supplied to each sense area SA via the power source line VL2, and a potential of the operating potential SAP is stabilized by the compensation capacitance 30 arranged on the memory mat MATa that is located at the far end. The potential of the operating potential SAP becomes unstable as a distance from the power source circuit 40 increases; however, because the compensation capacitance 30 is arranged at a position farthest from the power source circuit 40, the operating potential SAP is also supplied to the sense area SA at the far end, in a correct manner. The compensation capacitance area 20 is omitted from FIG. 6.

Figure 7:
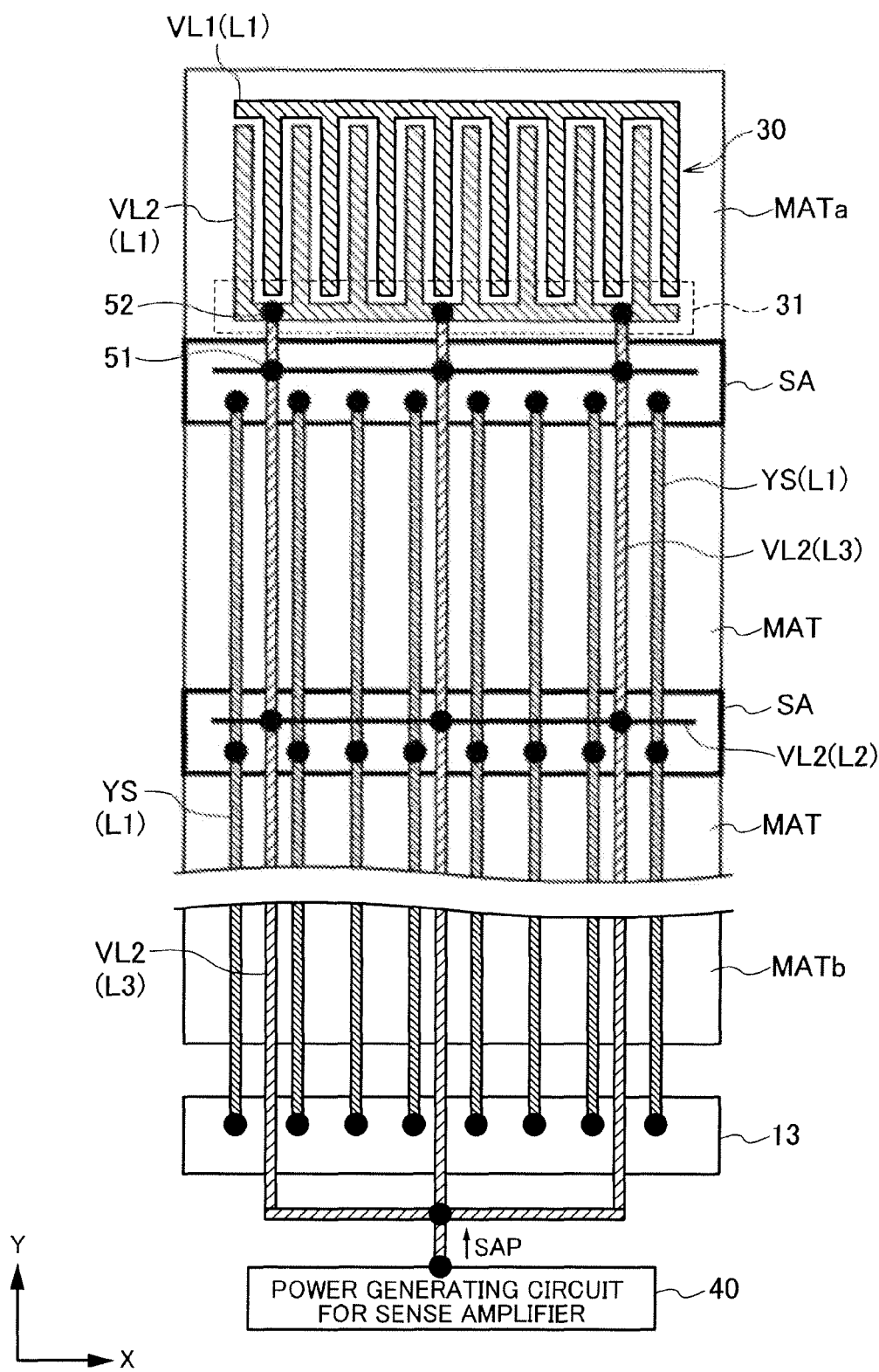
FIG. 7 is a diagram indicative of an embodiment of the configuration of the main parts of FIG. 6 in more detail.

Turning to FIG. 7, the operating potential SAP generated by the power source circuit 40 is commonly supplied to a plurality of sense areas SA via the power source line VL2. The power source line VL2 is formed in a plurality of wiring layers. In FIG. 7, a portion denoted by reference character VL2(L1) is formed in a first metal wiring layer, a portion denoted by reference character VL2(L2) is formed in a second metal wiring layer, and a portion denoted by reference character VL2(L3) is formed in a third metal wiring layer. The first metal wiring layer is a metal wiring layer located on the lowermost layer, and the second metal wiring layer and the third metal wiring layer are formed in this order on layers above the first metal wiring layer.

The power source line VL2 (L3) formed in the third metal wiring layer is provided while extending in the Y direction to pass an upper portion of the memory mat MAT. On the other hand, the power source line VL2(L2) formed on the second metal wiring layer is provided while extending in the X direction to pass an upper portion of the sense area SA. A contact conductor 51 is provided at an intersection of the power source line VL2(L3) and the power source line VL2(L2), so that the power source lines VL2(L3) and VL2(L2) are short-circuited via the contact conductor 51. With this configuration, the power source line VL2 is formed in a mesh shape.

Although not shown in FIG. 7, other power source lines and signal lines are formed on the second and third metal wiring layers in practice, and the power source lines formed on these wiring layers are designed to have a wide line width. Therefore, there is substantially no empty space on the second and third metal wiring layers on the memory mat MAT. On the other hand, the column selection line YS is arranged on the first metal wiring layer. As shown in FIG. 7, the column selection line YS is provided while extending in the Y direction over the other memory mats MAT and MATb except for the memory mat MATa at the far end. The notation "YS(L1)" in FIG. 7 means that the column selection line YS is formed in the first metal wiring layer. Therefore, there is substantially no empty space over the other memory mats MAT and MATb except for the memory mat MATa located at the far end.

On the other hand, over an upper portion of the memory mat MATa located at the far end, the column selection line YS is not formed in the first metal wiring layer, and therefore there is an empty space in the first metal wiring layer. In the present embodiment, the compensation capacitance 30 for the power-source voltage is formed in the first metal wiring layer by using this empty space. As described above, the compensation capacitance 30 is constituted by the power source lines VL1 and VL2 formed in a comb shape, and these power source lines respectively function as capacitance electrodes. Among these power source lines, the power source line VL2(L1) is connected to the power source line VL2(L3) formed in the third metal wiring layer via a contact conductor 52 formed on a connection area 31. To the power source line VL1(L1) which is the other one of the power source lines, a ground potential is supplied via another connection area (not shown).

Figure 8:
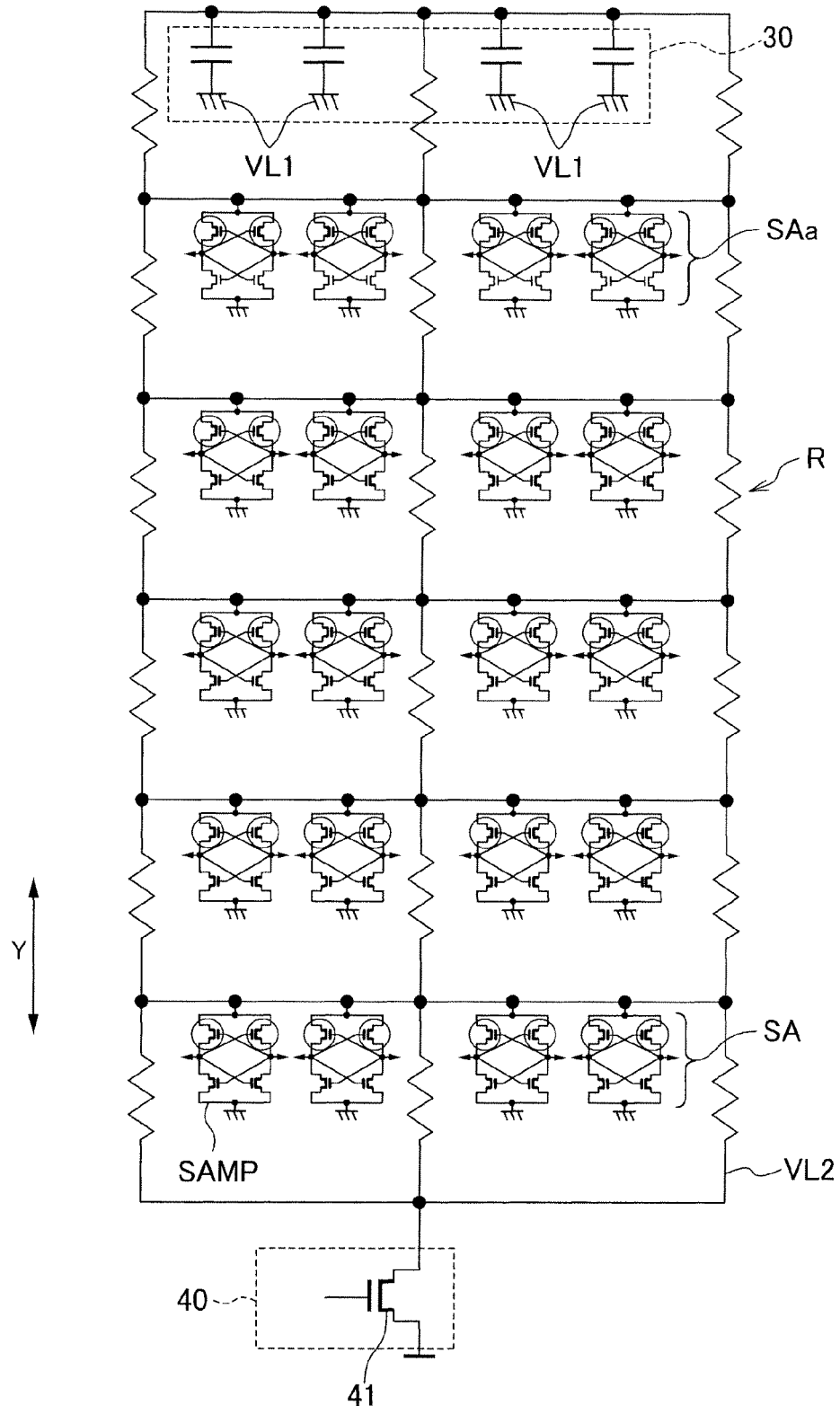
FIG. 8 is a circuit diagram indicative of an embodiment of the sense area SA.

Turning to FIG. 8, the sense amplifier SAMP provided in the sense area SA is constituted by a pair of P-channel MOS transistors that are cross-coupled to each other and a pair of N-channel MOS transistors that are cross-coupled to each other, and sources of the P-channel MOS transistors are connected to the power source line VL2. A transistor denoted by reference numeral 41 in FIG. 8 is a driver circuit that supplies the operating potential SAP to the power source line VL2, which is included in the power source circuit 40.

Because the power source line VL2 is designed to have a sufficient line width, a line resistance R is relatively small. However, because a voltage fall is more likely to occur with an increasing distance from the power source circuit 40, the operating potential SAP supplied to a sense area SAa that is located at the far end can be possibly lowered. Nevertheless, in the present embodiment, because the compensation capacitance 30 for the power-source voltage is arranged on the memory met MATa located at the far end, it is possible to stabilize the operating potential SAP supplied to the sense area SAa located at the far end.

As explained above, in the present embodiment, because the compensation capacitance 30 is arranged on the memory mat MATa located at the far end, it is possible to stabilize the internal power-source voltage. Furthermore, if the number of the compensation capacitances 21 and 22 using the gate capacitances of the MOS transistors can be reduced by providing the compensation capacitance 30, it is possible to downsize the chip dimension. Alternatively, by leaving an empty space in the first metal wiring layer on the memory mat MATa located at the far end at an early stage of designing and arranging the compensation capacitance 30 in the empty space in the first metal wiring layer when the compensation capacitance for the power-source voltage is insufficient at a later stage of designing, it is possible to increase the compensation capacitance for the power-source voltage in a simple manner without changing the designing such as a mask for diffusion region.

It is apparent that the present invention is not limited to the above embodiments, but may be modified and changed without departing from the scope and spirit of the invention.

Figure 9:
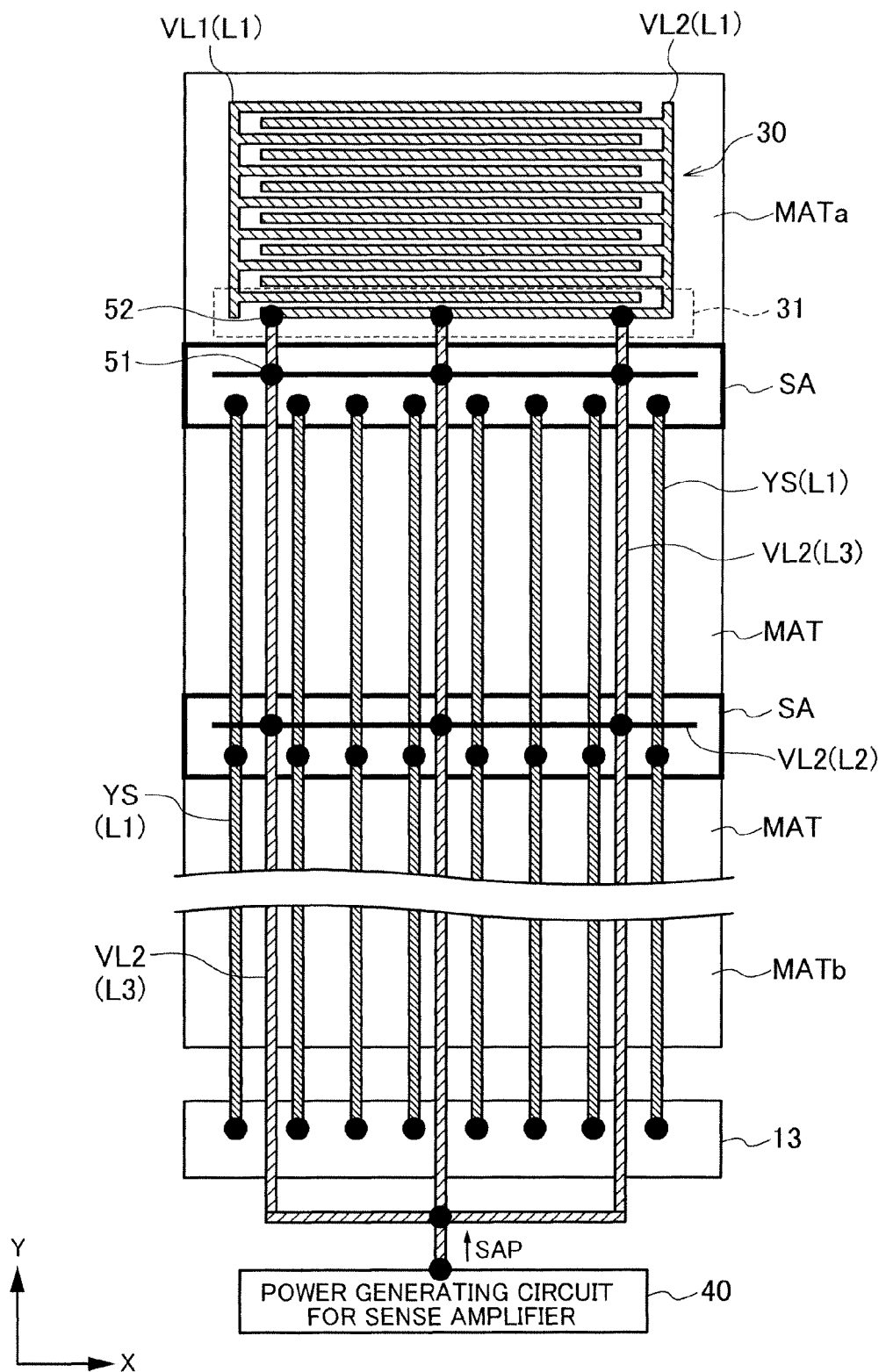
FIG. 9 is a diagram indicative of an embodiment of a shape of a compensation capacitance for the power-source voltage according to a modification.
Figure 10:
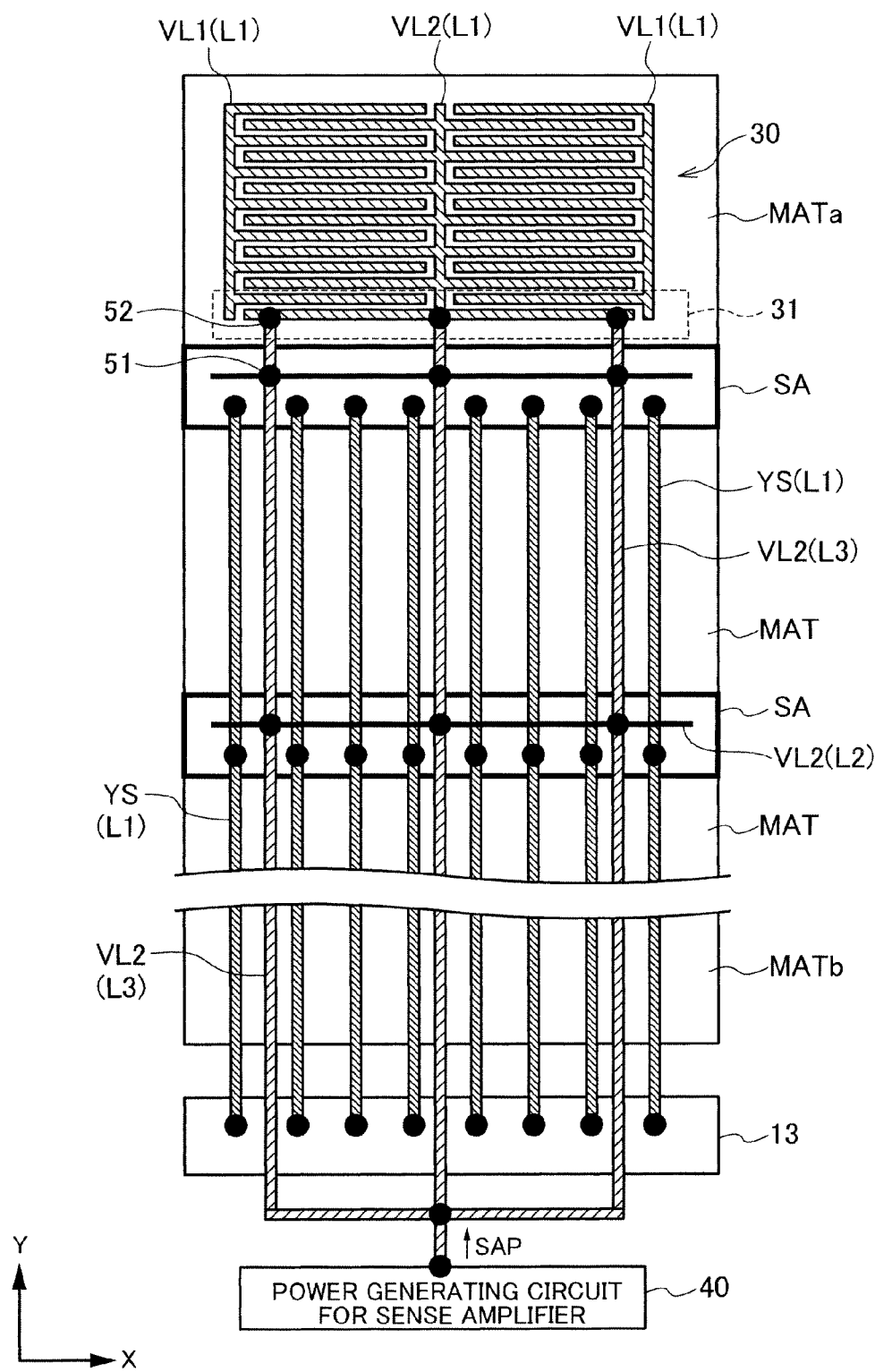
FIG. 10 is a diagram indicative of an embodiment of a shape of a compensation capacitance for the power-source voltage according to another modification.

For example, although the present embodiment described above has explained an example in which the comb-shaped power source lines VL1 and VL2 that constitute the compensation capacitance 30 are extended in the Y direction as shown in FIG. 7, the comb-shaped power source lines VL1 and VL2 can be extended in the X direction as shown in FIG. 9. Furthermore, the shape of the power source lines VL1 and VL2 is not limited to the comb shape, and can be a shape shown in FIG. 10.

Figure 11:
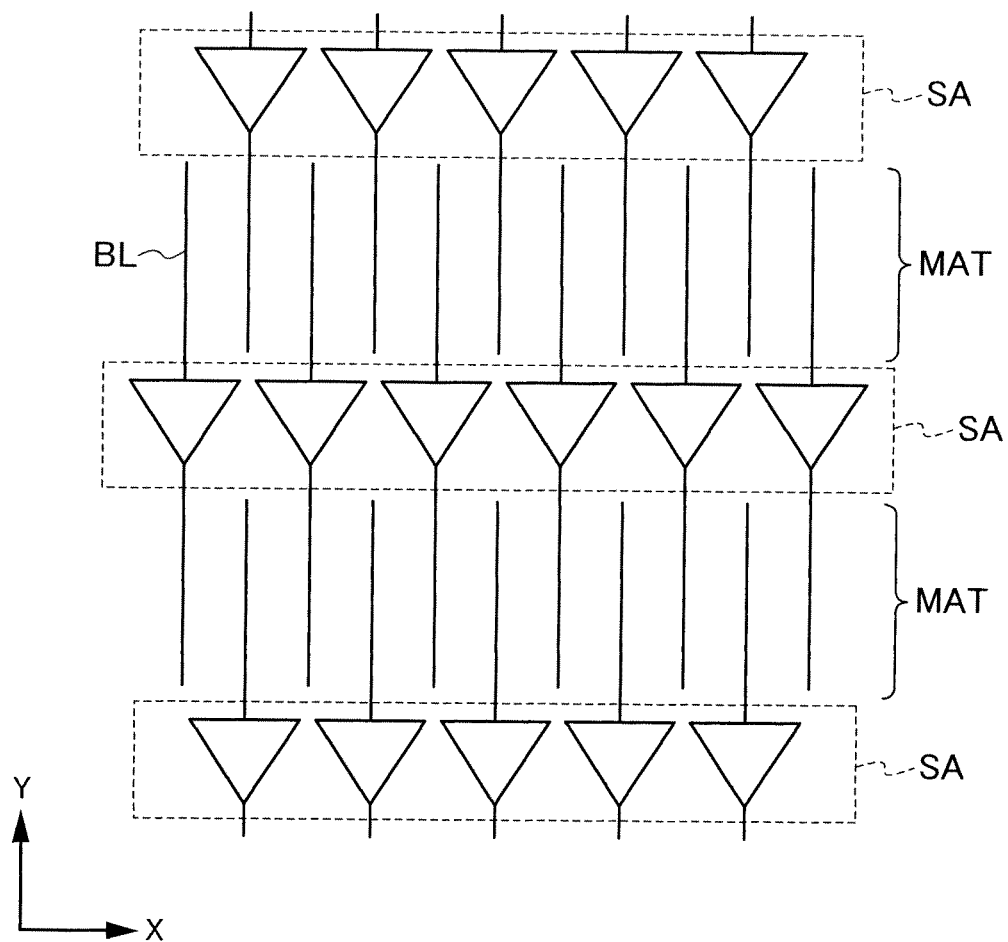
FIG. 11 is a schematic diagram for explaining memory mats of an open bit line architecture.
Figure 12:
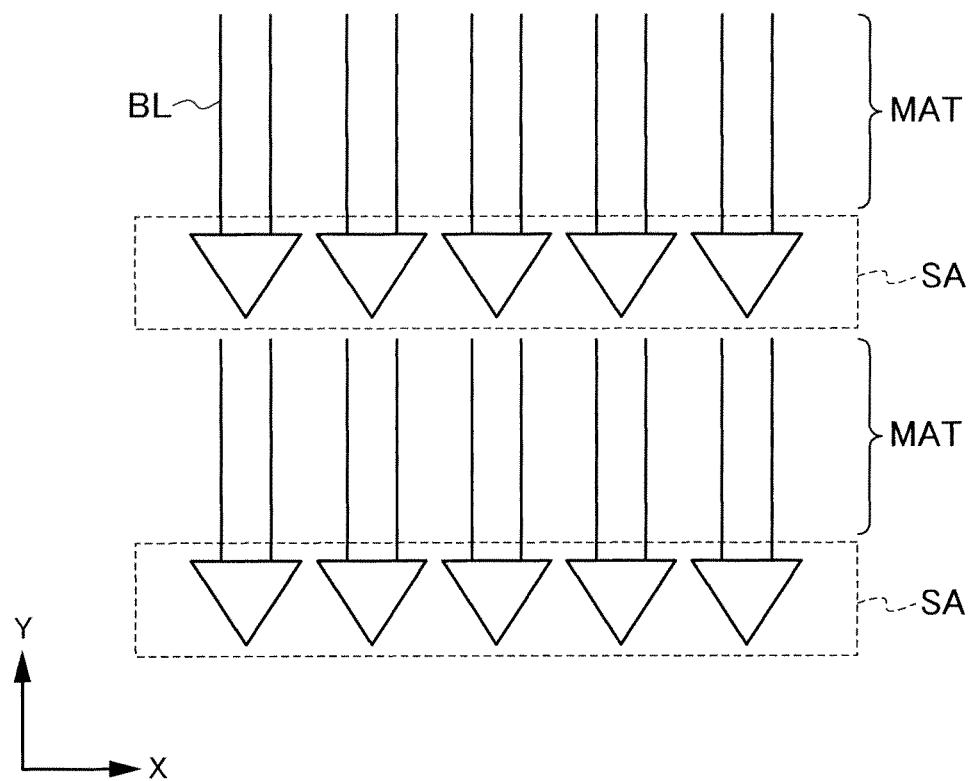
FIG. 12 is a schematic diagram for explaining memory mats of a folded bit line architecture.

In addition, the configuration of the memory mat MAT is not limited to any specific type, and can be, for example, a so-called open bit line architecture as shown in FIG. 11 or a so-called folded bit line architecture as shown in FIG. 12. In the open bit line architecture shown in FIG. 11, two bit lines BL making a pair are respectively arranged in two memory mats MAT that are adjacent to each other in the Y direction; therefore, the sense area SA is provided only on one side in the memory mats MATa and MATb that are located at both ends in the Y direction (see FIG. 2). On the other hand, in the folded bit line architecture shown in FIG. 12, two bit lines BL making a pair are arranged in the same memory mat MAT; therefore, the sense area SA is provided only on one side in either one of the memory mats MATa and MATb that are located at both ends in the Y direction.

This means that there is always an empty space in the metal wiring layer on the memory mat MATa located at the far end in the open bit line architecture, while there sometimes is an empty space or no empty space in the metal wiring layer on the memory mat MATa located at the far end in the folded bit line architecture according to the side of the memory mat MAT where the sense area SA is arranged. Considering this point, it is more preferable to apply the present invention to a semiconductor device of an open bit line architecture.

Figure 13:
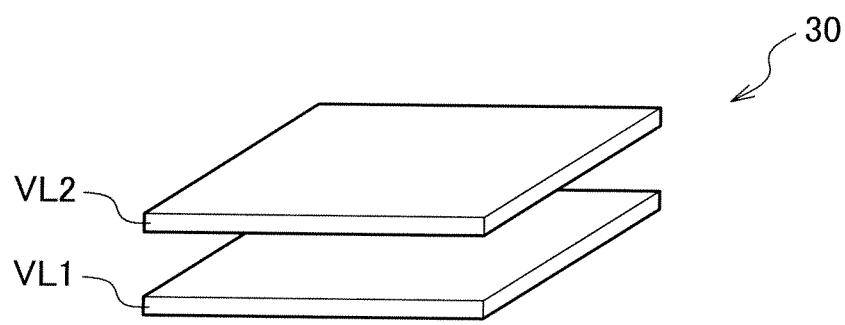
FIG. 13 is a schematic diagram for explaining an example of forming the compensation capacitance for the power-source voltage in a three-dimensional manner.

In addition, in the embodiment described above, although the two power line sources VL1 and VL2 that constitute the compensation capacitance 30 are formed in the same wiring layer, the present invention is not limited thereto. As shown in FIG. 13, a three-dimensional capacitor can be configured by forming the power source lines VL1 and VL2 in wiring layers different from each other. For example, this configuration can be achieved by forming the power source line VL1 in the first metal wiring layer as the column selection line YS and forming the power source line VL2 in the second metal wiring layer. By configuring such a three-dimensional capacitor, it is possible to increase the compensation capacitance for the power-source voltage. However, in this case, it requires empty spaces in two wiring layers and a design change on two wiring layers when changing capacitance of the compensation capacitance for the power-source voltage at the designing stage. Considering these points, it is preferable to form both the power source lines VL1 and VL2 in a single wiring layer as described in the above embodiment.

What is claimed is:
1. A semiconductor device comprising:
   a plurality of memory mats arranged in a first direction;
   a plurality of sense areas each arranged between two of the memory mats, each of the sense areas including a plurality of sense amplifiers selected based on a column selection signal;

a column decoder generating the column selection signal;
a column selection line extending in the first direction on the memory mats and supplying the column selection signal from the column decoder to the sense areas; and
a compensation capacitance provided on one of the memory mats which is located farther than the other of the memory mats from the column decoder,
wherein the compensation capacitance includes a first capacitance electrode to which a first power source potential is supplied and a second capacitance electrode to which a second power source potential is supplied, and at least one of the first and second capacitance electrodes is formed in a same wiring layer as the column selection line.

2. The semiconductor device as claimed in claim 1, wherein both the first and second capacitance electrodes are formed in a same wiring layer as the column selection line.

3. The semiconductor device as claimed in claim 1, wherein
one of the first and second capacitance electrodes is formed in a same wiring layer as the column selection line, and
the other one of the first and second capacitance electrodes is formed in a wiring layer different from the column selection line.

4. The semiconductor device as claimed in claim 1, wherein the first power source potential is an operating potential of the sense amplifiers.

5. The semiconductor device as claimed in claim 1, further comprising:
a power source circuit generating the first power source potential; and
a power source line connected between the power source circuit and the first capacitance electrode,
wherein the power source line is formed in a wiring layer different from the column selection line.

6. The semiconductor device as claimed in claim 5, wherein the power source line is arranged on the memory mats to extend in the first direction.

7. A semiconductor device comprising:
first and second memory mats each including a plurality of bit lines;
a sense area arranged between the first and second memory mats;
a column selection line provided on the first memory mat; and
a compensation capacitance provided on the second memory mat, wherein
the sense area includes a plurality of sense amplifiers,
each of the sense amplifiers is connected to an associated one or ones of the bit lines,
at least one of the sense amplifiers is selected based on a column selection signal supplied via the column selection line, and
at least a part of the compensation capacitance is formed in a same wiring layer as the column selection line.

8. The semiconductor device as claimed in claim 7, wherein the column selection line is not provided on the second memory mat.

9. The semiconductor device as claimed in claim 7, wherein each of the sense amplifiers is connected to an associated one of the bit lines provided on the first memory mat and connected to an associated one of the bit line provided on the second memory mat.

10. The semiconductor device as claimed in claim 7, wherein
the compensation capacitance includes a first capacitance electrode to which a first power source potential is supplied and a second capacitance electrode to which a second power source potential is supplied, and
both the first and second capacitance electrodes are formed in a same wiring layer as the column selection line.

11. The semiconductor device as claimed in claim 10, wherein the first power source potential is an operating potential of the sense amplifiers.

12. The semiconductor device as claimed in claim 10, further comprising:
a power source circuit generating the first power source potential; and
a power source line connected between the power source circuit and the first capacitance electrode,
wherein the power source line is formed in a wiring layer different from the column selection line.

* * * * *